United States Patent
Fukaya et al.

(10) Patent No.: US 8,444,799 B2
(45) Date of Patent: May 21, 2013

(54) METHOD FOR MANUFACTURING SEMICONDUCTOR DEVICE AND SURFACE PROTECTIVE TAPE

(75) Inventors: Hironori Fukaya, Yokohama (JP); Yuzo Shimobeppu, Yokohama (JP); Kazuhiro Yoshimoto, Yokohama (JP); Kazuo Teshirogi, Yokohama (JP); Kazuyuki Uragou, Yokohama (JP); Mika Sakamoto, Yokohama (JP); Masaya Tazawa, Yokohama (JP)

(73) Assignee: Fujitsu Semiconductor Limited, Yokohama (JP)

( * ) Notice: Subject to any disclaimer, the term of this patent is extended or adjusted under 35 U.S.C. 154(b) by 343 days.

(21) Appl. No.: 12/874,659

(22) Filed: Sep. 2, 2010

(65) Prior Publication Data

US 2011/0048615 A1 Mar. 3, 2011

(30) Foreign Application Priority Data

Sep. 3, 2009 (JP) .................. 2009-203610

(51) Int. Cl.
*B32B 37/00* (2006.01)
(52) U.S. Cl.
USPC ......... 156/247; 156/153; 156/154; 156/272.2
(58) Field of Classification Search
USPC ................. 156/247, 272.2, 153, 154
See application file for complete search history.

(56) References Cited

U.S. PATENT DOCUMENTS

| 6,972,244 | B1 * | 12/2005 | Patwardhan et al. ......... 438/462 |
| 7,776,746 | B2 * | 8/2010 | Feng et al. ..................... 438/690 |
| 2007/0054469 | A1 * | 3/2007 | Yano et al. .................... 438/459 |
| 2010/0233868 | A1 * | 9/2010 | Maeda et al. ................ 438/464 |

FOREIGN PATENT DOCUMENTS

| JP | 2005-048039 A | 2/2005 |
| JP | 2006-282794 A * | 10/2006 |

OTHER PUBLICATIONS

Machine translation of Japanese Patent 2006-282794, date unknown.*
Noonan, Brian, et al, "The Advantages of Visible Light-Cure Adhesives", Appliance Magazine, Oct. 2007.*

* cited by examiner

*Primary Examiner* — Jeff Aftergut
(74) *Attorney, Agent, or Firm* — Fujitsu Patent Center

(57) ABSTRACT

A method for manufacturing a semiconductor device includes adhering an adhesive layer of a surface protective tape including a base material film, an intermediate layer disposed on the base material film, and the adhesive layer disposed on the intermediate layer to one surface of a semiconductor substrate; curing the intermediate layer while a flat plate is pressed against the base material film of the surface protective tape; grinding the other surface of the semiconductor substrate; curing the adhesive layer; and separating the surface protective tape from the semiconductor substrate.

6 Claims, 7 Drawing Sheets

METHOD FOR MANUFACTURING SEMICONDUCTOR DEVICE AND SURFACE PROTECTIVE TAPE

CROSS-REFERENCE TO RELATED APPLICATIONS

This application claims the benefit of priority from Japanese Patent Application No. 2009-203610 filed on Sep. 3, 2009, the entire contents of which are incorporated herein by reference.

BACKGROUND

1. Field

Embodiments discussed herein relate to a semiconductor device manufacturing method and a surface protective tape.

2. Description of Related Art

As a measure for reducing the thickness of the semiconductor elements, a back grinding method may be applied to a semiconductor substrate, for example, semiconductor wafer on one principal surface, for example, a front surface of which a plurality of semiconductor elements are formed. The back grinding method includes mechanically grinding the other principal surface, for example, a back surface, on which an electronic circuit is not formed, of the semiconductor substrate.

After the back grinding process, dicing process is performed to the semiconductor substrate to individuate the semiconductor element.

Related art is discussed in Japanese Unexamined Patent Application Publication No. 2005-48039, etc.

SUMMARY

According to one aspect of the embodiments, a method for manufacturing a semiconductor device includes adhering an adhesive layer of a surface protective tape including a base material film, an intermediate layer disposed on the base material film, and the adhesive layer disposed on the intermediate layer to one surface of a semiconductor substrate; curing the intermediate layer while a flat plate is pressed against the base material film of the surface protective tape; grinding the other surface of the semiconductor substrate; curing the adhesive layer; and separating the surface protective tape from the semiconductor substrate.

The object and advantages of the invention will be realized and achieved by means of at least the features, elements and combinations particularly pointed out in the claims.

It is to be understood that both the foregoing general description and the following detailed description are exemplary and explanatory and are not restrictive of the invention, as claimed.

DESCRIPTION OF EMBODIMENT(S)

The back grinding process is carried out by adhering a surface protective tape to one principal surface (front surface, on which a semiconductor element is formed) of a target semiconductor substrate, and then grinding the other principal surface (back surface, on which an electronic circuit is not formed) of the semiconductor substrate using a grinding grindstone.

Regarding the target semiconductor substrate that has been ground to reach a certain thickness, a dicing tape is adhered to the surface to be ground, and dicing process is carried out after the surface protective tape is separated.

FIGS. 1A, 1B, 1C and 1D illustrate an exemplary back-grinding process.

A semiconductor substrate 11 to be ground may include a plurality of bump electrodes 12 disposed as a terminal for external connection on one principal surface on which a semiconductor element is formed.

The one principal surface of the semiconductor substrate 11 may not be a flat due to the presence of the bump electrodes 12.

Figure 1A:
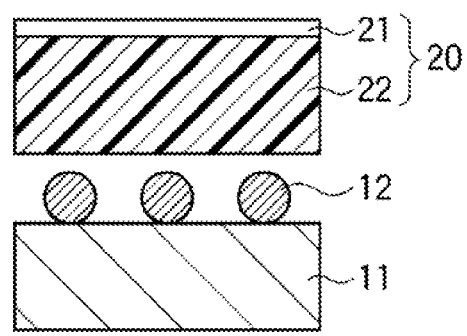
FIGS. 1A, 1B, 1C and 1D illustrate an exemplary semiconductor substrate back-grinding process.

As illustrated in FIG. 1A, a surface protective tape 20 having a resin layer 22 disposed on a base material film 21 is disposed on the one principal surface of the semiconductor substrate 11.

The thickness of the resin layer 22 in the surface protective tape 20 may be larger than the height of the bump electrodes 12.

Figure 1B:
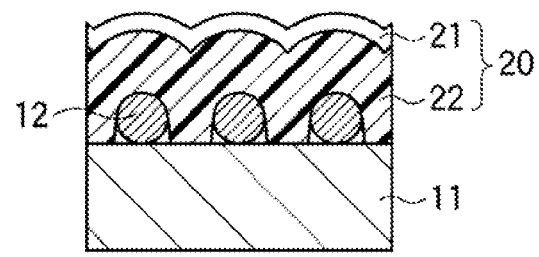

As illustrated in FIG. 1B, the surface protective tape 20 is adhered under pressure to the one principal surface of the semiconductor substrate 11.

The semiconductor substrate 11 to which the surface protective tape 20 is adhered is placed on a stage 31 of a grinding device, so that the side of the base material film 21 contacts the stage 31.

Figure 1C:
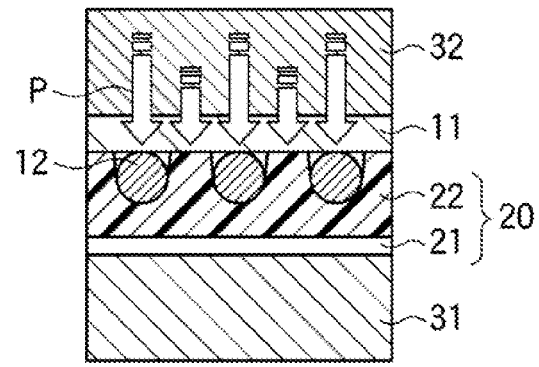

As illustrated in FIG. 1C, the other principal surface on which an electronic circuit is not formed of the semiconductor substrate 11 is grounded using a grinding grindstone 32.

In FIG. 1C, the pressuring direction during grinding is indicated by the arrow P.

Such grinding reduces the thickness of the semiconductor substrate 11 to reach a certain thickness.

Figure 1D:
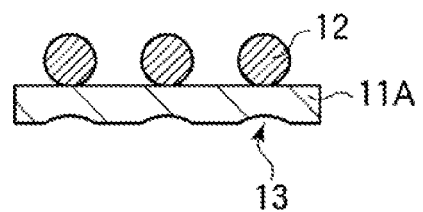

As illustrated in FIG. 1D, the surface protective tape 20 is separated and removed from a semiconductor substrate 11A whose thickness is reduced.

The semiconductor substrate 11A, which includes the bump electrodes 12 disposed as a terminal for external connection on the one principal surface and whose thickness is reduced by the back-grinding, may be cracked during the separation and removal of the surface protective tape 20 or the dicing process.

Thin portions (concave portions) 13 may be formed on the other principal surface, on which an electronic circuit is not formed, corresponding to the portions where the bump electrodes 12 are disposed as a terminal for external connection on one principal surface, on which a semiconductor element is formed, of the semiconductor substrate 11A as illustrated in FIG. 1D. Cracks may be formed in the thin portions 13.

The thin portions (concave portions) 13 generated on the other principal surface may be formed due to a pressure applied during the back grinding.

A high pressure is locally applied to portions on semiconductor substrate 11 where the bump electrodes 12 are formed and, while a low pressure is applied to the other portions of the semiconductor substrate 11. As a result, the thin portions 13 may be selectively formed.

Figure 2:
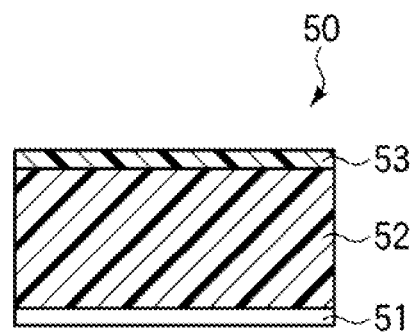
FIG. 2 illustrates an exemplary protective tape.

FIG. 2 illustrates an exemplary protective tape. FIG. 2 may illustrate a cross sectional view showing the structure of a surface of the protective tape.

A surface protective tape 50 includes a base material film 51, an intermediate layer 52 disposed on one principal surface of the base material film 51, and an adhesive layer (adhesion layer) 53 disposed on the intermediate layer 52 as illustrated in FIG. 2.

As materials for the base material film 51 may include materials capable of transmitting ultraviolet light (ultraviolet ray) or visible light.

When ultraviolet light or visible light is emitted from the side of the base material film 51 of the surface protective tape 50, the ultraviolet light or visible light reaches the intermediate layer 52 and/or the adhesive layer 53.

Materials for the base material film 51 may include materials having a high adhesiveness to the intermediate layer 52 when ultraviolet light or the like is emitted. The separation of the base material film 51 from the intermediate layer 52 may be reduced when the surface protective tape 50 is irradiated with ultraviolet light or the like.

Polyolefin resin or the like may be used as the materials for the base material film 51, for example.

The thickness of the base material film 51 may be 20 to 50 μm, for example.

It is a matter of course that the thickness of the base material film 51 is not limited to the range above and is selected as appropriate according to the shape or dimension of the bump electrodes (projection electrodes) disposed on the semiconductor substrate to which the surface protective tape 50 is adhered and the thickness of the intermediate layer 52 or the adhesive layer 53.

The materials for the intermediate layer 52 may include materials that are relatively easy to transform before curing.

When the surface protective tape 50 is adhered onto the semiconductor substrate on which projection electrodes, such as the bump electrodes which are formed, the surface protective tape 50 may be transformable according to the shape of the bump electrodes or the like.

As materials for the intermediate layer 52 may include a photocurable resin that may be cured by a light having a wavelength (wavelength band) different from a wavelength in the curing wavelength region of the adhesive layer 53 (a curing wavelength region, a curing wavelength band) described later.

The intermediate layer 52 may be selectively cured without curing the adhesive layer 53 by emitting a light having a wavelength in the curing wavelength region of the intermediate layer 52.

When an ultraviolet light curable resin that is cured by ultraviolet light (ultraviolet ray) is applied as the materials for the adhesive layer 53, a visible light curable resin may be selected, for example, as the materials for the intermediate layer 52.

The visible light curable resin may be a resin that is cured by irradiating the visible light.

The curing wavelength region of the intermediate layer 52 may be, for example, $\lambda a=500$ nm to $\lambda b=600$ nm.

The curing wavelength region $\lambda a$ to $\lambda b$ may be determined based on the type, composition, or the like of a photopolymerization initiator to be blended in the resin.

For example, a photocurable resin having a curing wavelength region of $\lambda a$ to $\lambda b$ may be obtained by blending a photopolymerization initiator which gives high sensitivity to the light of the wavelength region of $\lambda a$ to $\lambda b$ in the resin.

When the curing wavelength region of the intermediate layer 52 is 500 nm to 600 nm, a light having a peak wavelength $\lambda 1$ near 532 nm may be used as the light for curing the intermediate layer 52, for example.

The light is not limited to the light having a peak wavelength $\lambda 1$ near 532 nm. When a light containing wavelength components in the curing wavelength region $\lambda a$ to $\lambda b$ is emitted, the intermediate layer 52 may be cured.

In order to reduce curing the adhesive layer 53 when the intermediate layer 52 is cured, a light that does not contain the curing wavelength region components of the adhesive layer 53 may be used.

The intermediate layer 52 may have a sufficient thickness to the irregularities produced due to the bump electrodes formed on the semiconductor substrate.

The irregularities of the semiconductor substrate surface formed due to the bump electrodes may be absorbed and canceled by the intermediate layer 52 to sufficiently flatten the surface of the base material film 51.

The thickness of the intermediate layer 52 may be larger than the maximum height of the irregularities resulting from the bump electrodes and the like on the semiconductor substrate.

Therefore, the thickness of the intermediate layer 52 may be 30 to 300 μm corresponding to the irregularities produced due to the bump electrodes.

The thickness of the intermediate layer 52 is not limited to the range above, and may be selected based on the shape and dimension of the bump electrodes on the semiconductor substrate to which the surface protective tape 50 is adhered, the thickness of the base material film 51, the thickness of the adhesive layer 53, and the like.

The intermediate layer 52 may include a resin material as a main ingredient. For example, the intermediate layer 52 may include an acrylic resin.

In contrast, also as the materials for the adhesive layer 53, materials that are relatively easily transformed in the stage before curing may be selected.

When the surface protective tape 50 is adhered onto the semiconductor substrate on which the bump electrodes are formed, the surface protective tape 50 may be easily transformed corresponding to the shape of the bump electrodes or the like.

As materials for the adhesive layer 53, a photocurable resin may be selected that is cured by a light having a wavelength (wavelength band) different from a wavelength in the visible light region that corresponds to the curing wavelength region (a curing wavelength range, a curing wavelength band) of the intermediate layer 52, e.g., ultraviolet light (ultraviolet ray).

Thus, when a light (visible light) having a wavelength included in the curing wavelength region of the intermediate layer 52 is emitted, the intermediate layer 52 may be selectively cured without curing the adhesive layer 53.

Thus, the adhesive layer 53 may not be cured when a light for curing the intermediate layer 52 is emitted. The adhesiveness of the surface protective tape 50 to the principal surface of the semiconductor substrate may be sufficiently maintained.

The curing wavelength region of the adhesive layer 53 may be $\lambda c=200$ nm to $\lambda d=300$ nm, for example.

The curing wavelength region of the adhesive layer 53 may be determined based on the type or the like of a photopolymerization initiator to be blended in the resin.

For example, a photocurable resin having the curing wavelength region of $\lambda c$ to $\lambda d$ may be obtained by blending a photopolymerization initiator which gives high sensitivity to the light of a wavelength region of $\lambda c$ to $\lambda d$ in the resin.

When the curing wavelength region of the adhesive layer 53 is 200 nm to 300 nm, for example, a light having a peak wavelength $\lambda 2$ near 254 nm may be used as a light for curing the adhesive layer 53.

The light is not limited to the light having a peak wavelength $\lambda 2$ near 254 nm. When a light including wavelength components in the curing wavelength region $\lambda c$ to $\lambda d$ is emitted, the adhesive layer 53 may be cured.

The thickness of the adhesive layer 53 may be 5 to 30 μm, for example.

The thickness of the adhesive layer 53 is not limited to the value, and is selected based on the shape and dimension of the bump electrodes on the semiconductor substrate to which the surface protective tape 50 is adhered, the thickness of the base material film 51, the thickness of the intermediate layer 52, and the like.

As a resin as the main ingredients of the adhesive layer 53, an acrylic resin may be used, for example.

The surface protective tape 50 including the base material film 51, the intermediate layer 52, and the adhesive layer 53 may be formed in such a manner as to have a total thickness of about 260 μm.

Differences in the curing wavelength region between the intermediate layer 52 and the adhesive layer 53 are not limited to the combination of visible light and ultraviolet light (ultraviolet ray) as described above.

A combination of visible light and infrared light (infrared ray) or a combination of ultraviolet light (ultraviolet ray) and infrared light (infrared ray) may be acceptable.

Furthermore, a combination of long wavelength light and short wavelength light in the visible light region or the like may be acceptable.

Each light may not include light of the other wavelength region.

In any combination of curing wavelength regions, resin materials for the layers are selected so that the curing of the adhesive layer 53 is reduced when a light having a curing wavelength region of the intermediate layer 52 is emitted and the adhesive layer 53 is promptly cured when a light having a curing wavelength region of the adhesive layer 53 is emitted.

Figure 3A:
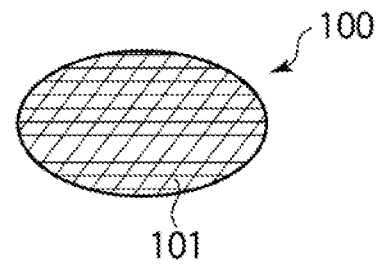
FIGS. 3A, 3B and 3C illustrate an exemplary for manufacturing a semiconductor device.
Figure 3B:
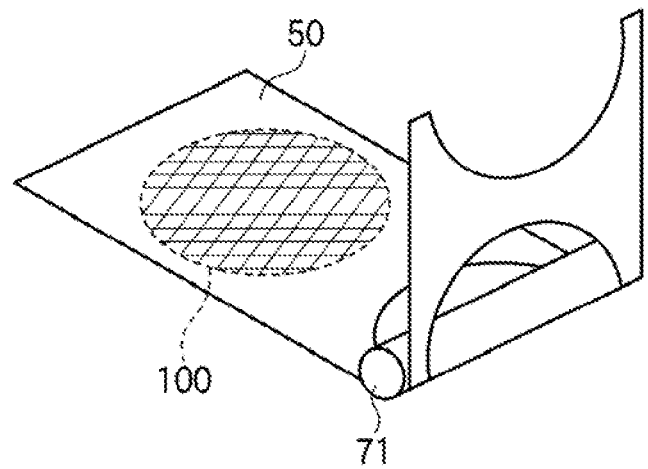
Figure 3C:
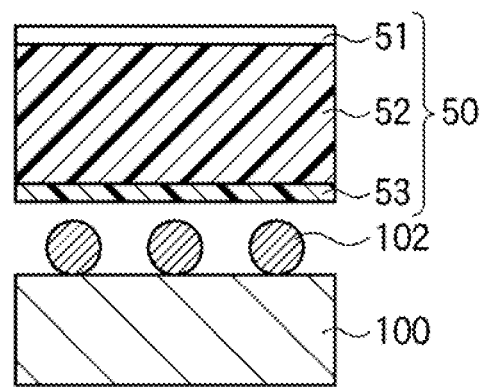

FIG. 3A to 3C illustrates an exemplary method for manufacturing a semiconductor device. As illustrated in FIG. 3A, a semiconductor substrate 100 on one principal surface of which a plurality of semiconductor elements 101 are formed is prepared.

As the semiconductor substrate 100, a silicon (Si) substrate or a gallium arsenide (GaAs) substrate may be applied.

A wafer process is applied, whereby a plurality of semiconductor elements 101 are formed on one principal surface (front surface) of the semiconductor substrate 100 that includes an active element, such as a transistor, a passive element, such as a resistive element, a capacity element, and a wiring layer forming an electronic circuit by mutually coupling the functional elements.

The wiring layer may be a multilayer wiring structure in which the layers are mutually insulated by an interlayer insulating layer.

An electrode terminal is disposed on the insulating layer covering the wiring layer of the top layer and a bump electrode (not shown) is disposed on the electrode terminal as an electrode for external connection.

When a solder bump is applied as the bump electrode, the diameter may be selected from the range of 20 μm to 200 μm. The height of the solder bump substantially corresponds to the diameter of the bump.

As illustrated in FIG. 3B, when grinding, for example, back grinding is performed to the other principal surface (back surface) of the semiconductor substrate 100, the surface protective tape 50 is adhered to one principal surface on which an electronic circuit is formed of the semiconductor substrate 100.

The surface protective tape 50 may have a width exceeding the diameter (e.g., 300 mmφ) of a target semiconductor substrate and may have a long size beforehand.

As illustrated in FIG. 3C, the adhesive layer 53 of the surface protective tape 50 is faced with one principal surface having an electronic circuit and bump electrodes 102 of the semiconductor substrate and is pressed to the one principal surface by a roller 71, and thus the surface protective tape 50 and the semiconductor substrate 100 are adhered to each other.

The surface protective tape 50 is adhered to the semiconductor substrate 100 by the roller 71 with the solder bump electrodes 102 disposed on each semiconductor element region 101 on one principal surface of the semiconductor substrate 100 facing the adhesive layer 53 of the surface protective tape 50.

After adhering, the surface protective tape 50 located in the circumference of the semiconductor substrate 100 is cut and removed.

Figure 4A:
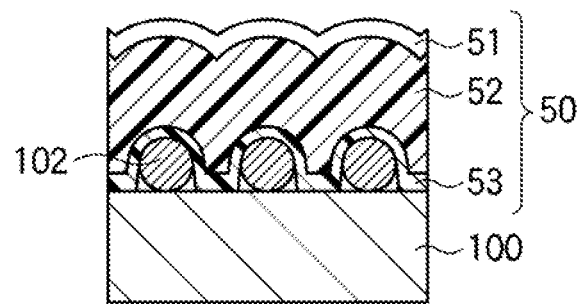
FIGS. 4A, 4B and 4C illustrate an exemplary for manufacturing a semiconductor device.

The upper surface of the surface protective tape 50 that is pressed by the roller 71, and covers the solder bump electrode 102 disposed on each of the two or more semiconductor element areas on one principal surface of the semiconductor substrate 100, for example, As illustrated in FIG. 4A, the upper surface of the base material film 51, irregularities including convex portions corresponding to the solder bump electrodes 102 may be produced.

Figure 4B:
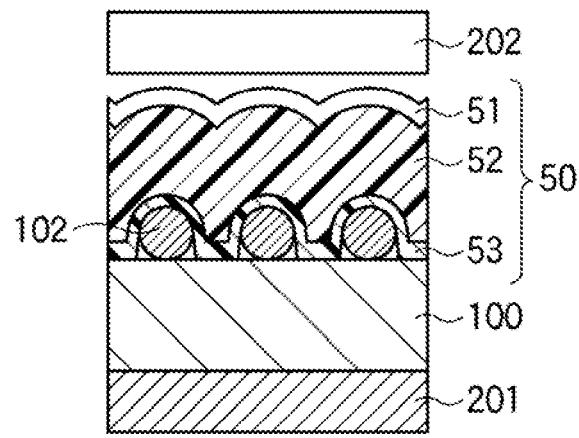

As illustrated in FIG. 4B, the semiconductor substrate 100 to the other principal surface of which the surface protective tape 50 is adhered is placed on a stage 201.

The upper surface of the stage 201 may include aluminum, stainless steel, or the like and the degree of flatness of the upper surface may be adjusted to about 5 μm.

The stage 201 has a vacuum suction mechanism for adsorbing and holding the target semiconductor substrate 100 (not shown).

A pressurizing flat plate 202 is disposed as a pressurizing unit above the stage 201.

Figure 4C:
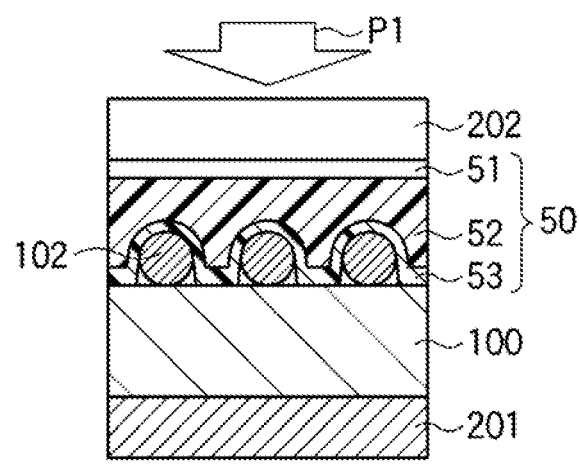

Then, as illustrated in FIG. 4C, the pressurizing flat plate 202 is pressurized from the side of the surface protective tape 50 (arrow P1) to flatten the upper surface of the surface protective tape 50.

The irregularities produced on the surface protective tape 50 corresponding to the solder bump electrodes 102 are absorbed by compression and transformation of the intermediate layer 52 to flatten the surface of the base material film 51 of the surface protective tape 50.

The pressure for pressurizing the surface protective tape 50 by the pressurizing flat plate 202 may be about 0.1 to about 1 MPa, for example. The surface protective tape 50 is compressed and the total thickness may be set to about 200 μm, for example.

Figure 5A:
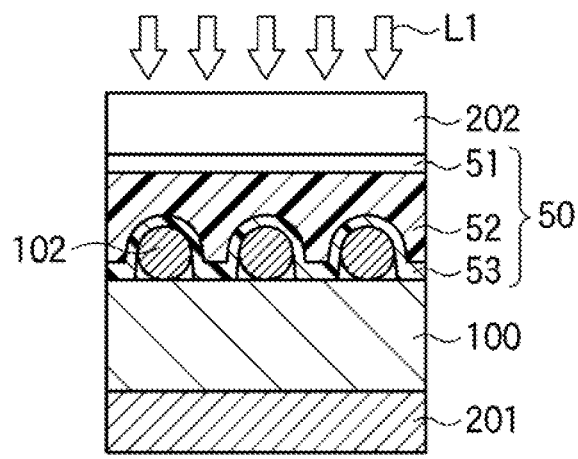
FIGS. 5A, 5B and 5C illustrate an exemplary for manufacturing a semiconductor device.

In such a state, as illustrated in FIG. 5A, the intermediate layer 52 of the surface protective tape 50 is irradiated with light (arrow L1) to cure the intermediate layer 52.

A light for curing the intermediate layer 52 is emitted from the side of the pressurizing plate 202 while pressurizing the surface protective tape 50 adhered onto the semiconductor substrate 100 by the pressurizing flat plate 202.

A light for curing the intermediate layer 52 is emitted from the side of the pressurizing flat plate 202 in a state where the surface of the base material film 51 is flattened.

When a material that is cured by visible light is selected as the intermediate layer 52, the intermediate layer 52 is irradiated with visible light through the pressurizing flat plate 202 and the base material film 51 to cure the intermediate layer 52.

When the curing wavelength region of the intermediate layer 52 is 500 to 600 nm, a light having a peak wavelength $\lambda 1$ near 532 nm, for example, may be used as the light for curing the intermediate layer 52 and the quantity of light may be adjusted to about 200 to about 500 mW/cm$^2$.

When a material that is cured by ultraviolet light is selected as the intermediate layer 52, ultraviolet light is emitted through the pressurizing flat plate 202 and the base material film 51 to cure the intermediate layer 52.

The curing wavelength region of the adhesive layer 53 may be different from that of ultraviolet light.

Materials that transmit a light that cures the intermediate layer 52, such as a glass substrate, may be applied as the pressurizing flat plate 202 and the thickness of the pressurizing flat state 202 may be about 5 to about 20 mm. The degree of flatness of the surface, for example, the surface of the surface protective tape 50 which is in contact with the base material film 51 may be 5 μm or lower.

The degree of surface flatness of the base material film 51 may be 5 μm or lower.

As a light source for curing the intermediate layer 52 of the surface protective tape 50, a high-pressure mercury lamp emitting a light having a peak wavelength near 266 nm, near 365 nm, and near 532 nm may be used.

A light having a peak wavelength $\lambda 1$ near 532 nm, for example, may be obtained by applying a short wavelength cut filter having a cutoff wavelength of about 422 nm.

The intermediate layer 52 may be cured but the adhesive layer 53 may not be cured.

The lamp (light source) is not limited to the high-pressure mercury lamp, and when a light having a certain wavelength is obtained by a combination with a filter, a halogen lamp or a xenon lamp may also be applied.

As the filter, a filter capable of blocking the wavelength components of the curing wavelength region of the adhesive layer 53 may be used.

The intermediate layer 52 may be selectively cured without curing the adhesive layer 53 by applying a light obtained by a combination of a light source that emits light having a plurality of peak wavelengths and a filter.

The intermediate layer 52 is selectively cured without curing the adhesive layer 53 by irradiation of the light having a selected wavelength.

Since the adhesion (adhesive strength) of the adhesive layer 53 may not decrease, a state where the surface protective tape 50 is adhered to the semiconductor substrate 100 is maintained.

Figure 5B:
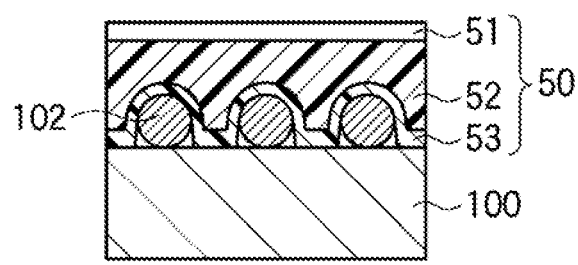

When the intermediate layer 52 of the surface protective tape 50 is transformed and cured by such pressurization and irradiation of light, as illustrated in FIG. 5B, the pressurizing flat plate 202 is removed and the integrated semiconductor substrate 100 and the surface protective tape 50 adhered onto one principal surface thereof is removed from the stage 201.

The surface of the base material film 51 of the surface protective tape 50 may be flattened and may be parallel to one principal surface of the semiconductor substrate 100.

Since the intermediate layer 52 of the surface protective tape 50 is cured, the flat state of the surface of the base material film 51 is maintained even after removing the pressurizing flat plate 202 from the surface protective tape 50.

Figure 5C:
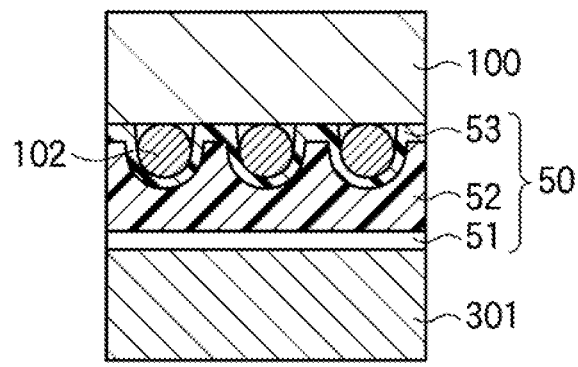

Subsequently, as illustrated in FIG. 5C, the integrated semiconductor substrate 100 and surface protective tape 50 adhered onto one principal surface of the integrated semiconductor substrate 100 is placed on a stage 301 of a back grinding device.

The base material film 51 of the surface protective tape 50 is placed contacting the upper surface of the stage 301.

The integrated semiconductor substrate 100 and surface protective tape 50 is placed in such a manner that the other principal surface, for example, back surface on which an electronic circuit is not formed of the semiconductor substrate 100 serves as the upper surface.

The integrated semiconductor substrate 100 and surface protective tape 50 adhered onto one principal surface thereof is adsorbed and held by an adsorbing device (not shown) provided on the stage 301 of the back grinding device.

Figure 6A:
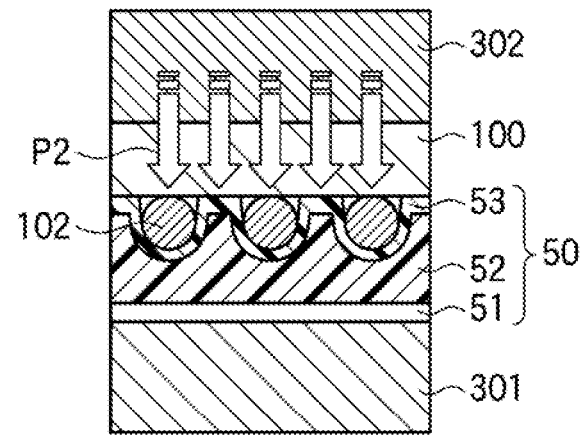
FIGS. 6A, 6B and 6C illustrate an exemplary for manufacturing a semiconductor device.

After an appropriate period of time, as illustrated in FIG. 6A, the other principal surface, for example, back surface on which an electronic circuit is not formed of the semiconductor substrate 100 is ground using a grinding grindstone 302 to reduce the thickness of the semiconductor substrate 100 to a desired thickness.

In FIG. 6A, the pressurization direction during grinding is indicated by the arrow P2.

The grinding process to the other principal surface, for example, back surface on which an electronic circuit is not formed of the semiconductor substrate 100 is performed with rotation of the stage 301 on which the integrated semiconductor substrate 100 and surface protective tape 50 adhered onto one principal surface thereof is adsorbed and held and the pressurization and rotation of the grinding grindstone 302.

In such a grinding process, the integrated semiconductor substrate 100 and surface protective tape 50 adhered onto one principal surface thereof is pressurized in the lamination direction thereof. The height of the bump electrodes 102 of the semiconductor substrate 100 is absorbed by the intermediate layer 12 of the surface protective tape 50 and the intermediate layer 52 is cured.

The pressure during grinding may be uniformly applied throughout the other principal surface, for example, back surface on which an electronic circuit is not formed of the semiconductor substrate 100.

Irrespective of the presence of the bump electrodes 102, a flat ground surface is formed on the other principal surface of the semiconductor substrate 100 without generating thin portions corresponding to the presence of the bump electrodes 102.

When the thickness of the semiconductor substrate 100 is set to a certain thickness, the back grinding process may be terminated.

After an appropriate period of time, separation process between the semiconductor substrate 100 and the surface protective tape 50 adhered onto one principal surface thereof is performed.

The surface protective tape 50 is separated from the surface of the semiconductor substrate 100 by reducing the adhesive strength of the adhesive layer 53 of the surface protective tape 50.

Figure 6B:
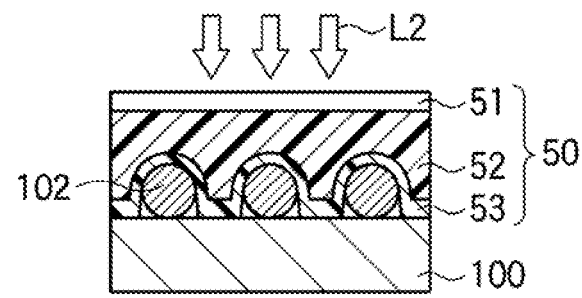
Figure 6C:
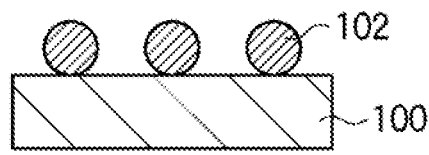

When a material that is cured by ultraviolet light is selected as the adhesive layer 53, ultraviolet light is emitted through the base material film 51 and the intermediate layer 52 (arrow L2) to cure the adhesive layer 53 as illustrated in FIG. 6B.

When the curing wavelength region of the adhesive layer 53 is 200 to 300 nm, a light having a peak wavelength $\lambda 2$ near 266 nm, for example, may be used as the light for curing the adhesive layer 53 and the quantity of light may be adjusted to about 200 to about 500 mW/cm².

As a light source for curing the adhesive layer 53, a high-pressure mercury lamp emitting light having a peak wavelength near 266 nm, near 365 nm, and near 532 nm, for example, may be used.

A light having a peak wavelength λ2 near 266 nm, for example, may be obtained by applying a long wavelength cut filter having a cutoff wavelength of about 300 nm.

The adhesive layer 53 may be cured.

The lamp (light source) is not limited to the high-pressure mercury lamp, and when a light having a certain wavelength may be obtained by a combination with a filter, a halogen lamp or a xenon lamp may also be applied.

When the intermediate layer 12 is cured when the adhesive layer 53 is cured, the curing of the intermediate layer 12 may be reduced by selecting the wavelength region of the emitted light.

After an appropriate period of time, the surface protective tape 50 having the adhesive layer 53 that is cured by the ultraviolet light irradiation process to reduce the adhesive strength is separated from one principal surface of the semiconductor substrate 100.

As illustrated in FIG. 5C, the semiconductor substrate 100 on one principal surface of which the bump electrodes are disposed and in which the thickness is reduced to a given thickness is obtained.

A dicing tape (not shown) is attached to the other principal surface, for example, the surface to be polished of the semiconductor substrate 100, and then dicing process is performed to the semiconductor substrate 100, whereby the semiconductor substrate 100 is divided (individuated) into individual semiconductor elements 101 (not shown).

The semiconductor elements 101 each have the bump electrode 102 disposed on one principal surface on which an electronic circuit is formed.

The attachment of the dicing tape to the back surface of the semiconductor substrate may be performed after the back grinding process of the semiconductor substrate and before separating the surface protective tape 50.

As the surface protective tape 50 to be applied for grinding the back surface of the semiconductor substrate having projection electrodes, such as the bump electrodes 102, disposed as a terminal for external connection of a semiconductor element, a three-layer structure including the base material film 51, the intermediate layer 52, and the adhesive layer 53 is applied.

The surface protective tape 50 is disposed on the principal surface on which an electronic circuit is formed of the semiconductor substrate, and the surface protective tape 50 is pressured against the principal surface of the semiconductor substrate. The convex portions formed by the projection electrodes are absorbed by transformation of the intermediate layer 52, so that the surface of the base material film 51 and the principal surface of the semiconductor substrate are substantially parallel to each other.

The parallel of the surface of the base material film 51 of the surface protective tape 50 and the principal surface of the semiconductor substrate may be maintained by irradiating the intermediate layer 52 with light energy for curing the intermediate layer 52.

Since the intermediate layer 52 is cured, the back surface of the semiconductor substrate may be uniformly pressurized when the back surface of the semiconductor substrate is ground.

Even when the back grinding process is performed, thin portions corresponding to the presence of the projection electrodes may not be produced in the semiconductor substrate, and cracks in the semiconductor substrate or the semiconductor element may be reduced.

Since the intermediate layer 52 is selectively cured, the adhesive strength of the adhesive layer 53 may not decrease. During the grinding process, the semiconductor substrate may be supported by the surface protective tape 50.

When the surface protective tape 50 is separated from the semiconductor substrate, light energy for curing the adhesive layer 53 is emitted.

Since the adhesive layer 53 may be cured to reduce the adhesive strength, the surface protective tape 50 having the adhesive layer 53 may be easily separated and the adhesive layer 53 or the like remaining on the surface of the projection electrodes, the semiconductor substrate, or the like may be reduced.

The production yield of semiconductor devices having projection electrodes, such as bump electrodes, may be increased.

For example, the projection electrode disposed on the semiconductor substrate 100 may be the solder bump 102 and may not be the solder bump 102.

Figure 7:
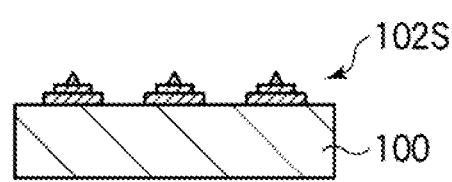
FIG. 7 is a process cross-sectional view showing a modification embodiment of the semiconductor device manufacturing method of the invention.

As illustrated in FIG. 7, a bump electrode 102S formed using a bonding wire may be applied as the projection electrode to be disposed on the electrode terminal on the semiconductor substrate 100.

Such a bump electrode 102S is formed by forming a ball at the tip of the bonding wire containing a gold (Au) wire by electric discharge, for example, adhering the ball by thermo-compression bonding onto the electrode terminal (not shown) on the semiconductor substrate 100, and cutting the bonding wire at the upper portion of the ball after an appropriate period of time.

The above-mentioned back grinding process may be applied to the manufacturing process of the semiconductor device to which such a bump electrode 102S is applied.

An acrylic resin may or may not be used as a resin as the main ingredients of the intermediate layer 52 of the surface protective tape 50.

an acrylic resin may or may not be used as a resin as the main ingredients of the adhesive layer 53.

The resin that is cured by visible light may be used as the intermediate layer 52 of the surface protective tape 50. The resin that is cured by ultraviolet light may be applied as the adhesive layer 53. The resin that is cured by ultraviolet light may be used as the intermediate layer 52 of the surface protective tape 50. The resin that is cured by visible light may be used as the adhesive layer 53. A resin that is cured by visible light may be used for both the intermediate layer 52 and the adhesive layer 53.

The intermediate layer 52 and the adhesive layer 53 may be individually solidified with the light in the visible light region by selecting a light of a long wavelength region, for example, red base light and a light of a short wavelength region in the visible light region, for example, blue base light, and giving a curing wavelength region to each of the intermediate layer 52 and the adhesive layer 53 so that the wavelengths are different from each other.

The intermediate layer 52 and the adhesive layer 53 may be individually solidified with the light in the ultraviolet light region by selecting an ultraviolet light of a long wavelength region and an ultraviolet light of a short wavelength region in the ultraviolet light region and giving a curing wavelength region to each of the intermediate layer 52 and the adhesive layer 53 so that the wavelengths are different from each other.

Example embodiments of the present invention have now been described in accordance with the above advantages. It will be appreciated that these examples are merely illustrative of the invention. Many variations and modifications will be apparent to those skilled in the art.

All examples and conditional language recited herein are intended for pedagogical objects to aid the reader in understanding the invention and the concepts contributed by the inventor to furthering the art, and are to be construed as being without limitation to such specifically recited examples and conditions. Although the embodiment(s) of the present inventions have been described in detail, it should be understood that the various changes, substitutions, and alterations could be made hereto without departing from the spirit and scope of the invention.

The invention claimed is:

1. A method for manufacturing a semiconductor device, comprising:
   adhering an adhesive layer of a surface protective tape to one surface of a semiconductor substrate, the surface protective tape including a base material film, an intermediate layer disposed on the base material film, and the adhesive layer disposed on the intermediate layer;
   curing the intermediate layer;
   grinding another surface of the semiconductor substrate;
   curing the adhesive layer after curing the intermediate layer; and
   separating the surface protective tape from the semiconductor substrate,
   wherein the intermediate layer includes a first photocurable resin, and the adhesive layer includes a second photocurable resin which is different from the first photocurable resin;
   wherein the first photocurable resin includes a visible light curable resin and the second photocurable resin includes an ultraviolet light curable resin; and
   wherein visible light is emitted when curing the intermediate layer and ultraviolet light is emitted when curing the adhesive layer.

2. The method according to claim 1, wherein curing the intermediate layer includes: curing the intermediate layer while a flat plate is pressed against the base material film of the surface protective tape.

3. The method according to claim 1, wherein the intermediate layer is cured by emitting a light including wavelength components in a curing wavelength region of the first photocurable resin and not including wavelength components of a curing wavelength region of the second photocurable resin.

4. The method according to claim 2, wherein the flat plate includes a material that transmits light, and wherein the intermediate layer is cured when emitting the light from the side of the flat plate.

5. The method according to claim 1, wherein a plurality of projection electrodes are formed on the one surface of the semiconductor substrate, and a thickness of the intermediate layer is larger than a height of the plurality of electrodes.

6. The method according to claim 2, wherein the intermediate layer and the adhesive layer transform according to the shape of electrodes when the flat plate is pressed.

* * * * *